(12) United States Patent
Sugahara et al.

(10) Patent No.: US 11,228,076 B2
(45) Date of Patent: Jan. 18, 2022

(54) MULTILAYER CIRCUIT BOARD COMPRISING SERIALLY CONNECTED SIGNAL LINES AND STUBS DISPOSED IN DIFFERENT LAYERS OF THE MULTILAYER CIRCUIT BOARD

(71) Applicant: Murata Manufacturing Co., Ltd., Kyoto (JP)

(72) Inventors: Tadashi Sugahara, Kyoto (JP); Takaaki Ishii, Kyoto (JP); Kengo Onaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/929,291

(22) Filed: Jul. 15, 2020

(65) Prior Publication Data

US 2020/0344875 A1   Oct. 29, 2020

Related U.S. Application Data

(63) Continuation of application No. PCT/JP2019/030412, filed on Aug. 2, 2019.

(30) Foreign Application Priority Data

Aug. 6, 2018   (JP) .............................. JP2018-147547

(51) Int. Cl.
*H01P 1/203*   (2006.01)
*H01P 3/08*   (2006.01)
(Continued)

(52) U.S. Cl.
CPC .......... *H01P 1/20345* (2013.01); *H01P 1/203* (2013.01); *H01P 1/2135* (2013.01);
(Continued)

(58) Field of Classification Search
CPC .. H01P 1/20345; H01P 1/20354; H01P 1/203; H01P 1/2135; H01P 3/088
(Continued)

(56) References Cited

U.S. PATENT DOCUMENTS 8,049,578 B1 *  11/2011  Albers et al. ......... H01P 1/2135
                                                          333/134
2004/0119562 A1   6/2004  Sakano
(Continued)

FOREIGN PATENT DOCUMENTS

JP   H04-287503 A   10/1992
JP   2004-200941 A   7/2004
(Continued)

OTHER PUBLICATIONS

International Search Report for PCT/JP2019/030412, dated Oct. 8, 2019.
(Continued)

*Primary Examiner* — Benny T Lee
(74) *Attorney, Agent, or Firm* — Pearne & Gordon LLP (57) ABSTRACT

The present disclosure relates to an interposer (120), which is a circuit board that has a multilayer structure and that establishes a connection between layers using a via conductor. The interposer (120) includes first and second transmission lines that are connected in series and a first stub and a second stub that are respectively connected to the first transmission line and the second transmission line. The first and second stubs are formed by wiring lines provided in respective different layers, and a second transmission line (123), which connects the first stub to the second stub, includes a via conductor and a wiring line provided in the layer where the second stub (124) is formed.

20 Claims, 10 Drawing Sheets

(51) Int. Cl.
*H01Q 1/22* (2006.01)
*H05K 1/02* (2006.01)
*H05K 1/11* (2006.01)
*H01Q 1/24* (2006.01)
*H01Q 1/38* (2006.01)
*H01Q 9/27* (2006.01)
*H03H 7/38* (2006.01)
*H01P 1/213* (2006.01)

(52) U.S. Cl.
CPC ............... *H01P 3/08* (2013.01); *H01P 3/088* (2013.01); *H01Q 1/2283* (2013.01); *H01Q 1/243* (2013.01); *H01Q 1/38* (2013.01); *H01Q 9/27* (2013.01); *H03H 7/38* (2013.01); *H05K 1/0243* (2013.01); *H05K 1/115* (2013.01); *H05K 2201/10098* (2013.01)

(58) Field of Classification Search
USPC .................................................. 333/204, 246
See application file for complete search history.

(56) References Cited

U.S. PATENT DOCUMENTS

| 2015/0180107 | A1 | 6/2015 | Ao et al. |
| 2017/0346188 | A1 | 11/2017 | Shimura |
| 2018/0084637 | A1 | 3/2018 | Ueda |

FOREIGN PATENT DOCUMENTS

| JP | 2005-197843 A | 7/2005 |
| JP | 2011-009505 A | 1/2011 |
| JP | 2017-216589 A | 12/2017 |
| JP | 2018-046213 A | 3/2018 |

OTHER PUBLICATIONS

Written Opinion issued for PCT/JP2019/030412, dated Oct. 8, 2019.

* cited by examiner

MULTILAYER CIRCUIT BOARD COMPRISING SERIALLY CONNECTED SIGNAL LINES AND STUBS DISPOSED IN DIFFERENT LAYERS OF THE MULTILAYER CIRCUIT BOARD

This is a continuation of International Application No. PCT/JP2019/030412 filed on Aug. 2, 2019 which claims priority from Japanese Patent Application No. 2018-147547 filed on Aug. 6, 2018. The contents of these applications are incorporated herein by reference in their entireties.

BACKGROUND OF THE DISCLOSURE

Field of the Disclosure

The present disclosure relates to a circuit board, a circuit board module, and an antenna module.

Description of the Related Art

On a circuit board used in an antenna module or the like, for example, a filter may be provided that allows radio frequency signals of a desired frequency band to pass therethrough and blocks unnecessary radio frequency signals. Such a filter may have a circuit configuration in which, for example, a plurality of stubs are connected to a signal line (a transmission line). When the plurality of stubs are formed in different layers of a circuit board, the stubs are connected to each other by via conductors.

Specifically, in Patent Document 1 (Japanese Unexamined Patent Application Publication No. 2017-216589), in a band elimination filter, a spiral-shaped first stub is formed in a layer under a signal line of a coplanar line, the signal line and the first stub are connected by a via conductor. Furthermore, in this band elimination filter, a spiral-shaped second stub is formed in a layer under the layer where the first stub is formed, and the first stub and the second stub are connected by a via conductor.

Patent Document 1: Japanese Unexamined Patent Application Publication No. 2017-216589 (Published date: Dec. 7, 2017)

SUMMARY OF THE DISCLOSURE

In a case where a circuit board has a circuit configuration in which a plurality of stubs are formed to obtain desired circuit characteristics, the stubs need to be connected by a wiring line having a line length determined through design. However, as disclosed in Patent Document 1, when the stubs formed in the different layers of the circuit board are connected by via conductors, in order to ensure that the wiring line has the line length determined through design, the number of layers of the circuit board needs to be increased, thereby increasing the number of via conductor stages.

In a case where the number of via conductor stages is increased and the stubs are connected to each other, there is a problem in that it becomes difficult to achieve matching between the stubs and the transmission loss of the entire circuit board in which the stubs are formed increases. In addition, in a case where the number of layers of the circuit board is increased, there is a problem in that the size of the entire circuit board cannot be more compact.

Thus, the objects of the present disclosure are to solve these problems, to provide a circuit board in which stubs formed in different layers of the circuit board are connected to each other and that can be made more compact and suppress transmission loss, and to provide a circuit board module and an antenna module including the circuit board.

A circuit board according to an embodiment of the present disclosure that has a multilayer structure and establishes a connection between layers using a via conductor includes a plurality of signal lines connected in series and a plurality of stubs connected to the plurality of respective signal lines, and the plurality of stubs are formed by wiring lines provided in respective different layers, and at least one of the signal lines that connects the plurality of stubs includes the via conductor and the wiring line provided in the layer where the stub is formed.

A circuit board module according to an embodiment of the present disclosure and configured to be connected to an antenna includes the above-described circuit board and a radio frequency integrated circuit device that is mounted on the circuit board and connected to one end portion of the signal line, and the circuit board has, on a surface on an opposite side to a surface where the radio frequency integrated circuit device is mounted, a connection portion that connects the antenna to another end portion of the signal line.

An antenna module according to an embodiment of the present disclosure includes an antenna, the above-described circuit board, and a radio frequency integrated circuit device that is mounted on the circuit board and connected to one end portion of the signal line, and the circuit board has, on a surface on an opposite side to a surface where the radio frequency integrated circuit device is mounted, a connection portion that connects the antenna to another end portion of the signal line.

According to the present disclosure, at least one of signal lines that establish connections between stubs includes a via conductor and wiring lines provided in the layers where stubs are formed, and thus, compared with a case where connections between the stubs are established using only via conductors, a circuit board can be made more compact and the transmission loss at the circuit board can be suppressed.

DETAILED DESCRIPTION OF THE DISCLOSURE

In the following, embodiments of the present disclosure will be described in detail with reference to the drawings. Note that identical or substantially the same features are denoted by the same reference numerals throughout the drawings and a description thereof may not be repeated.

First Embodiment

Figure 1:
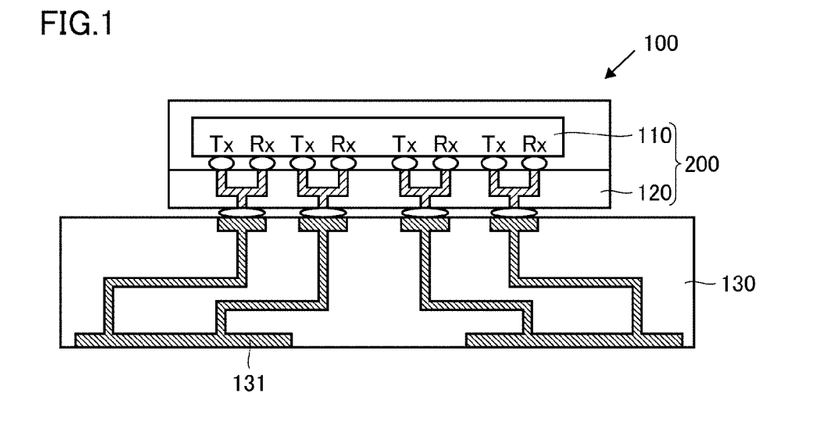
FIG. 1 is a cross section of an example of an antenna module according to a first embodiment.
Figure 2:
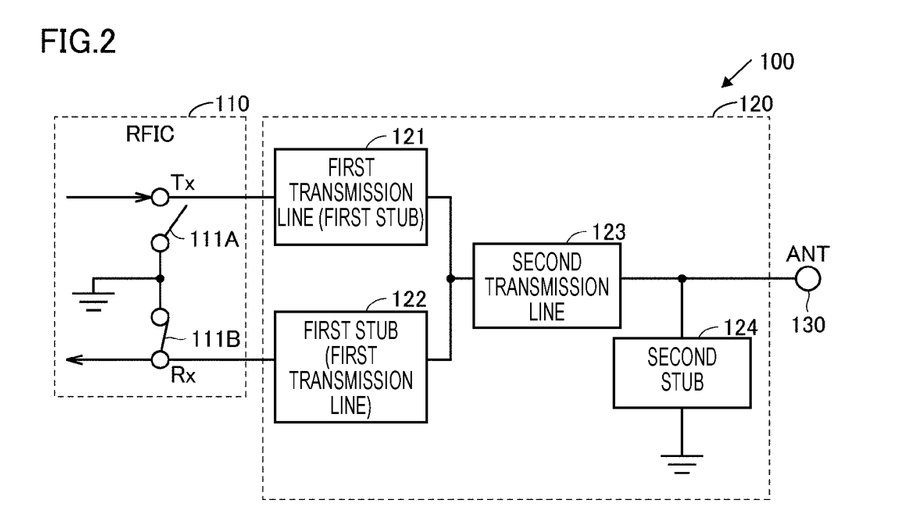
FIG. 2 is a block diagram of the example of the antenna module according to the first embodiment.

FIG. 1 is a cross section of an example of an antenna module 100 according to a first embodiment. FIG. 2 is a block diagram of the example of the antenna module 100 according to the first embodiment. The antenna module 100 is used in portable terminals such as a cellular phone, a smartphone, or a tablet and communication devices such as personal computers with communication functions by being connected to, for example, a baseband signal processing circuit.

The antenna module 100 includes a radio frequency integrated circuit (RFIC) 110 as an example of a power feed circuit, an interposer 120 as an example of a circuit board, and an antenna array (ANT) 130. The antenna module 100 up-converts a signal transferred from an unillustrated baseband signal processing circuit into a radio frequency signal and emits the radio frequency signal from the antenna array (ANT) 130, and also down-converts a radio frequency signal received by the antenna array (ANT) 130 and transfers the resulting signal to the baseband signal processing circuit. In the first embodiment, the antenna module 100 is a so-called "dual-band antenna module" that deals with two specific frequency bands.

Note that, in FIG. 1, only a configuration corresponding to two antennas 131 among a plurality of antennas 131 included in the antenna array (ANT) 130 is illustrated to simplify a description, and a configuration corresponding to the other antennas 131 having substantially the same configuration is omitted. In addition, in the first embodiment, a case where the antennas 131 are patch antennas having a rectangular flat plate shape is described as an example. The configuration having the RFIC 110 and the interposer 120, i.e., the configuration of the antenna module 100 without the antenna array (ANT) 130, is referred to as a circuit board module 200.

The RFIC 110 is a radio frequency integrated circuit device that includes, for example, a plurality of switches, a plurality of power amplifiers, a plurality of low noise amplifiers, a plurality of attenuators, a plurality of phase shifters, a signal multiplexer/demultiplexer, a mixer, and an amplifier circuit, which are unillustrated. In addition, the RFIC 110 includes a plurality of Tx terminals and a plurality of Rx terminals.

By referring to FIG. 2, in a case where a radio frequency signal is transmitted, the RFIC 110 transmits a radio frequency signal from a Tx terminal with a switch 111A turned off and a switch 111B turned on. In a case where a radio frequency signal is received, the RFIC 110 receives a radio frequency signal from an Rx terminal with the switch 111A turned on and the switch 111B turned off, which is not shown herein.

A radio frequency signal to be transmitted is transferred from the Tx terminal of the RFIC 110 to respective different antennas 131 (FIG. 1) via the interposer 120. Note that, in the RFIC 110, a signal is amplified by the built-in amplifier circuit and the amplified signal is up-converted by the mixer. In the RFIC 110, the up-converted radio frequency signal is split into signals by the signal multiplexer/demultiplexer, the signals are caused to pass through different signal paths, and the degrees of phase shift of the signals are individually adjusted by phase shifters arranged at the respective signal paths, so that the directivity of the antenna array (ANT) 130 is adjusted therein.

Radio frequency signals received by the respective antennas 131 pass through the interposer 120 and are inputted to the Rx terminal of the RFIC 110. The signals inputted to the Rx terminal are multiplexed by the signal multiplexer/demultiplexer of the RFIC 110, and the resulting signal is down-converted by the mixer and then amplified by the amplifier circuit.

The RFIC 110 is electrically connected to the interposer 120 by connecting the Tx terminal and the Rx terminal to terminals of the interposer 120 by solder bumps therein, as illustrated in FIG. 1. The interposer 120 is a circuit board provided between the RFIC 110 and the antenna array (ANT) 130, and includes for example a filter circuit and a matching circuit. In addition, the interposer 120 is, for example, a substrate in which a resin such as epoxy or polyimide is formed in a multilayer structure. The interposer 120 may be formed using a liquid crystal polymer (LCP) or a fluorine-based resin having a lower dielectric constant.

Note that, in FIG. 2, among a plurality of circuits included in the interposer 120, only a configuration corresponding to a set of the Tx terminal and the Rx terminal is illustrated to simplify a description, and a configuration corresponding to the other Tx and Rx terminals serving as the other sets is omitted. In addition, as an example, a case will be described below where the Tx terminal and the Rx terminal of the interposer 120 are different in port impedance and the interposer 120 includes a matching circuit that achieves resonance in two specific frequency bands.

With reference to FIG. 2, the interposer 120 includes a signal line 121 connected to the Tx terminal of the RFIC 110 and a signal line 122 connected to the Rx terminal of the RFIC 110. In a case where the switch 111A of the RFIC 110 is in an off state and the switch 111B is in an on state, the signal line 121 serves as a first transmission line through which a radio frequency signal from the Tx terminal is transmitted, and the signal line 122 serves as a first stub. In contrast, in a case where the switch 111A of the RFIC 110 is in an on state and the switch 111B is in an off state, the signal line 121 serves as the first stub, and the signal line 122 serves as a first transmission line through which a radio frequency signal is transmitted to the Rx terminal.

The interposer 120 further includes a second transmission line 123, which connects the signal lines 121 and 122 to the antenna array (ANT) 130, and a second stub 124 provided between the second transmission line 123 and the antenna array (ANT) 130.

A combination of the first stub and the first transmission line constitutes a circuit having a first resonant frequency, and a combination of the second stub 124 and the second transmission line 123 constitutes a circuit having a second resonant frequency. Thus, the line length of the first stub and that of the first transmission line are each determined in accordance with the first resonant frequency, and the line length of the second stub 124 and that of the second transmission line 123 are each determined in accordance with the second resonant frequency. In addition, the line width of the first stub, that of the second stub 124, and that of the second transmission line 123 are each determined in accordance with a characteristic impedance of the RFIC 110 and the antenna array (ANT) 130. The first stub, the second stub 124, and the second transmission line 123 have an impedance adjustment function and also function as a filter that allows signals of two specific target frequency bands to pass therethrough.

In the interposer 120, the signal lines 121 and 122, the second transmission line 123, and the second stub 124 are formed in a circuit board that has a multilayer structure and in which connections between the layers are established by via conductors. The signal lines 121 and 122, which serve as the first stub, and the second stub 124 are formed in different layers of the circuit board. In a conventional circuit configuration, a second transmission line that connects the first stub to the second stub, the first and second stubs being formed in different layers, is formed by via conductors.

However, in the interposer 120 according to the first embodiment, a second transmission line having a specific line length (for example, 1.2 mm) needs to be secured in order to realize a matching circuit that achieves resonance in two specific frequency bands (for example, the 28 GHz band and the 39 GHz band). When the second transmission line is formed by via conductors as in a conventional circuit configuration, the number of layers of the circuit board needs to be increased to increase the number of via conductor stages (for example, in the case of a via conductor having a height of 100 µm, the number of via conductor stages is a dozen or so) in order to secure the specific line length.

When the number of via conductor stages is increased, the line length of the second transmission line can be secured; however, it becomes difficult to achieve matching between the first stub and the second stub, and the transmission loss of the interposer 120 increases. In addition, in a case where the number of layers of the circuit board is increased by increasing the number of via conductor stages, the size of the interposer 120 itself increases.

Thus, in the interposer 120 according to the first embodiment, the second transmission line 123 includes a wiring line provided in the layer where the first stub or the second stub is formed. That is, the second transmission line 123 is not formed only by a via conductor or via conductors, and at least a portion of the second transmission line 123 is formed by a wiring line provided in the layer where the first stub is formed or a wiring line provided in the layer where the second stub is formed.

Figure 3A:
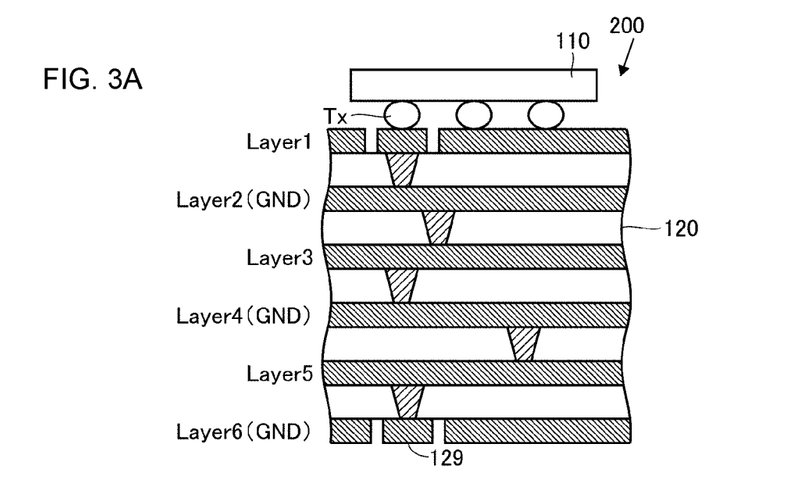
FIGS. 3A, 3B and 3C include schematic diagrams of an example of a circuit board module according to the first embodiment.
Figure 3B:
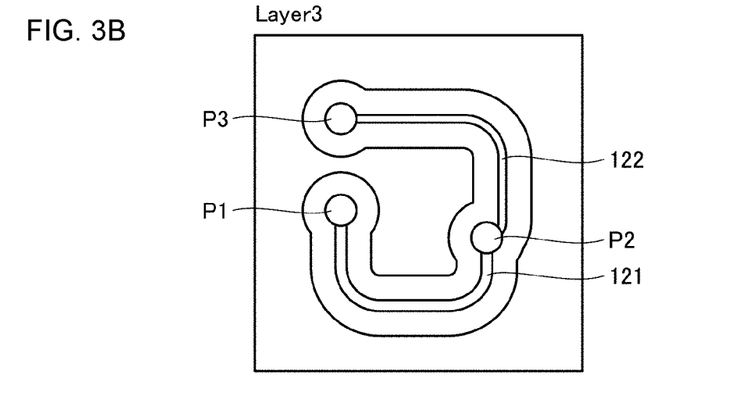
Figure 3C:
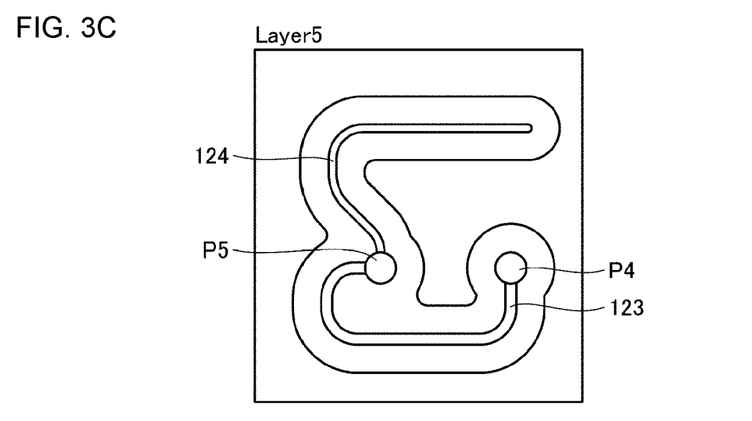

In the following, the wiring line shapes of the signal lines 121 and 122, the second transmission line 123, and the second stub 124 will be specifically described. FIGS. 3A, 3B and 3C include schematic diagrams of an example of the circuit board module 200 according to the first embodiment. FIG. 3A illustrates a cross section of the circuit board module 200, FIG. 3B illustrates a wiring diagram of Layer 3 of the interposer 120 therein, and FIG. 3C illustrates a wiring diagram of Layer 5 of the interposer 120 therein as illustrated in FIG. 3A.

As illustrated in FIG. 3A, the interposer 120 has a multilayer structure having Layers 1, 2, 3, 4, 5 and 6, and a connection between layers is established by a via conductor. In Layer 1 of the interposer 120, a wiring line for establishing a connection to a bump terminal of the RFIC 110 (for example, the Tx terminal) is formed. In Layer 3 of the interposer 120, the signal line 121 serving as the first transmission line and the signal line 122 serving as the first stub are formed as illustrated in FIG. 3B. At one end of the signal line 121, a via pad P1 for establishing a connection to the Tx terminal of the RFIC 110 is formed therein. At the other end of the signal line 121 (FIG. 3B), a via pad P2 (FIG. 3B) for establishing a connection to one end of the signal line 122 and to the second transmission line 123 of a lower layer is formed. At the other end of the signal line 122, a via pad P3 (FIG. 3B) for establishing a connection to the Rx terminal of the RFIC 110 is formed therein as illustrated in FIG. 3A.

In Layer 5 of the interposer 120, the second transmission line 123 and the second stub 124 are formed as illustrated in FIG. 3C. At one end of the second transmission line 123, a via pad P4 for establishing a connection to the signal line 121 (FIG. 3B) serving as the first transmission line of an upper layer is formed therein as illustrated in FIG. 3C. At the other end of the second transmission line 123, a via pad P5 for establishing a connection to one end of the second stub 124 and to the antenna array 130 (FIG. 1) of a lower layer is formed therein as illustrated in FIG. 3C. Note that the interposer 120 has a ground conductor (GND) located in Layer 4 (FIG. 11) between Layer 3 in which the first stub is formed and Layer 5 in which the second stub 124 is formed. Thus, the interposer 120 eliminates electromagnetic effects between the first stub and the second stub 124, which are formed in different layers. In FIG. 3A, Layers 2 and 6 are also ground conductors (GND). Note that Layers 1, 3, and 5 of the interposer 120 are electrically connected to each other by the via conductors, which are formed between the Layers, and the via pads. In addition, Layer 6 of the interposer 120 is a surface on the opposite side to the surface on which the RFIC 110, a radio frequency integrated circuit device, is mounted (Layer 1), and Layer 6 has a connection portion 129 (FIG. 3A), which connects the antenna array 130 to the end portion of the second transmission line 123.

It has been described that the second transmission line 123 is formed not by the via conductor connecting the layers in which the first stub and the second stub 124 are formed but by a wiring line provided in the layer in which the second stub 124 is formed (Layer 5). However, the second transmission line 123 may be formed by a wiring line provided in the layer in which the first stub is formed (Layer 3), or may be formed in a divided manner by a wiring line provided in the layer in which the first stub is formed (Layer 3) and a wiring line provided in the layer in which the second stub 124 is formed (Layer 5).

By forming the second transmission line 123 not by only a via conductor or via conductors but by a wiring line provided in another layer, the line length of the second transmission line 123 can be freely changed in accordance with circuit characteristics desired to be achieved by the interposer 120. In addition, compared with the case where the second transmission line 123 is formed by via conductors, the number of layers of the circuit board does not need to be increased to increase the number of via conductor stages, and thus the transmission loss of the interposer 120 can be suppressed and the interposer 120 itself can be reduced in size (thickness).

Note that the signal lines 121 and 122, the second transmission line 123, and the second stub 124 formed in the interposer 120 are formed by strip lines as illustrated in FIGS. 3A and 3B. However, the signal lines 121 and 122, the second transmission line 123, and the second stub 124 may be formed by, for example, microstrip lines or coplanar lines other than strip lines.

Two wiring line groups are connected to each antenna 131 (see FIG. 1), the two wiring line groups being each constituted by the signal lines 121 and 122, the second transmission line 123, and the second stub 124 illustrated in FIGS. 3B and 3C therein. Since the antenna array 130 (FIG. 1) is provided by two-dimensionally aligning the plurality of antennas 131, a plurality of wiring line groups each including the signal lines 121 and 122, the second transmission line 123, and the second stub 124 are also provided in the interposer 120.

Figure 4:
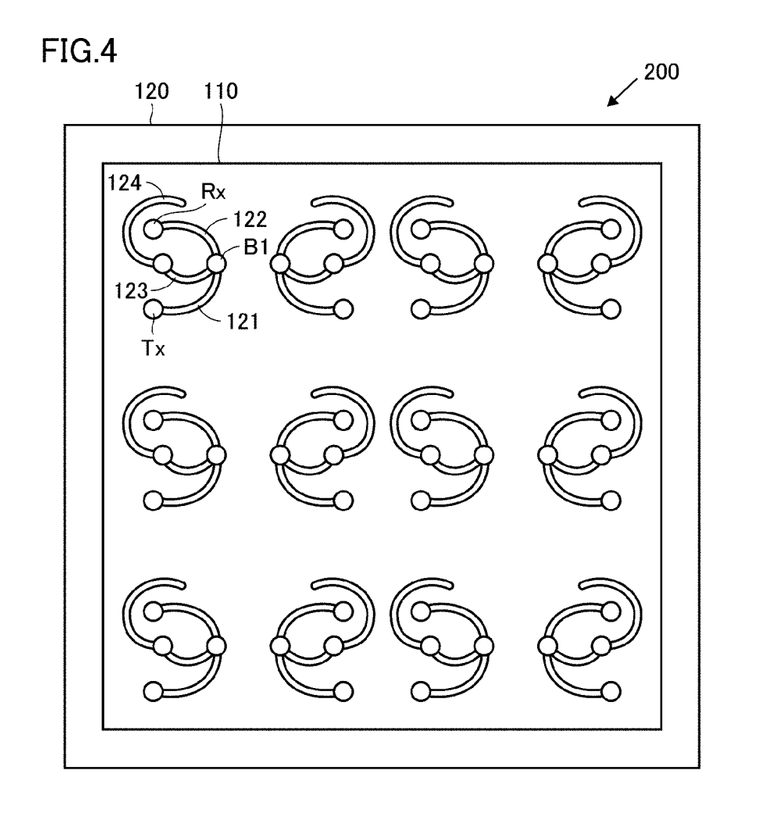
FIG. 4 is a plan view of the example of the circuit board module according to the first embodiment.

FIG. 4 is a plan view of the example of the circuit board module 200 according to the first embodiment. In the interposer 120, 12 wiring line groups each including the signal lines 121 and 122, the second transmission line 123, and the second stub 124 are provided as illustrated in FIG. 4. Each wiring line group corresponds to a set of Tx and Rx terminals of the RFIC 110.

Figure 5A:
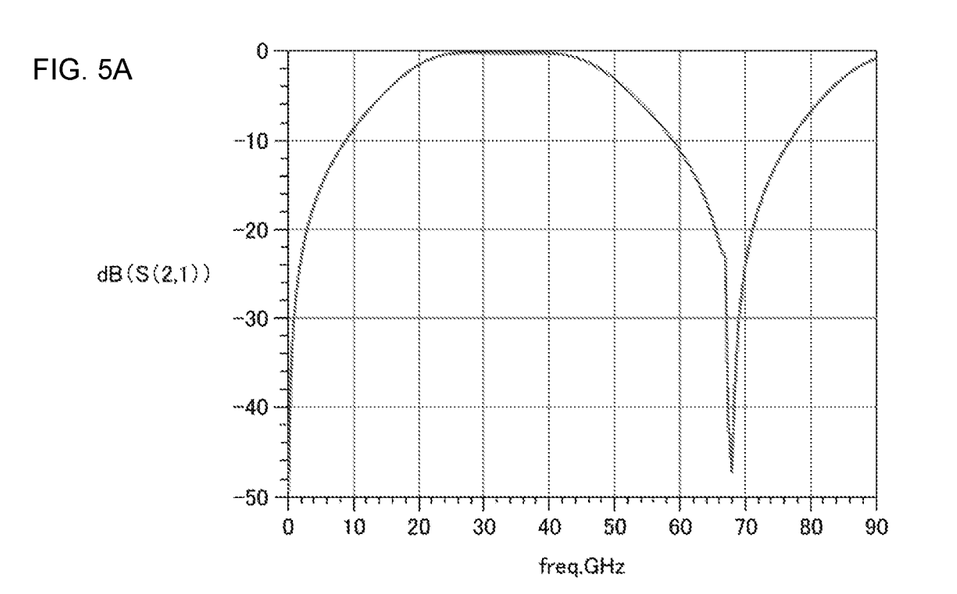
FIGS. 5A and 5B include graphs illustrating an example of circuit characteristics of an interposer according to the first embodiment.
Figure 5B:
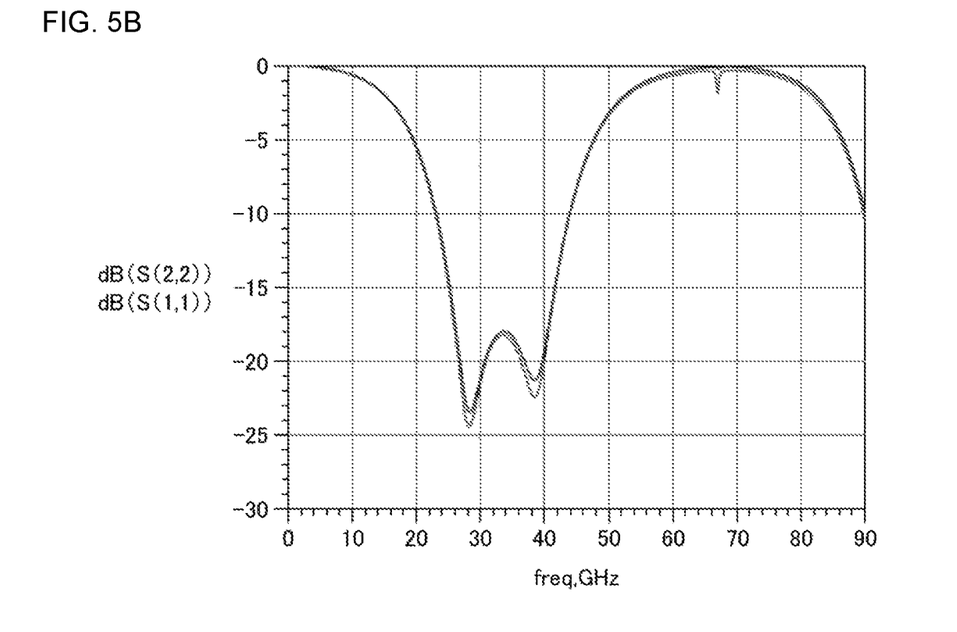

Next, circuit characteristics obtained in a case where the interposer 120 has the circuit configuration illustrated in FIG. 2 will be described in detail. FIGS. 5A and 5B include graphs illustrating an example of circuit characteristics of the interposer 120 according to the first embodiment. For signals of respective frequencies, FIG. 5A illustrates bandpass characteristics and FIG. 5B illustrates reflection characteristics. In the graph illustrated in FIG. 5A, the horizontal axis represents frequency Freq (GHz) and the vertical axis represents bandpass characteristics S(2, 1) (dB). In the graph illustrated in FIG. 5B, the horizontal axis represents frequency Freq (GHz) and the vertical axis represents reflection characteristics S(2, 2), S(1, 1) (dB). In this case, the bandpass characteristics S(2, 1) illustrate bandpass characteristics from the terminal connected to the RFIC 110 to the terminal connected to the antenna array 130 in the interposer 120 therein, as illustrated in FIG. 1. The reflection characteristics S(2, 2) illustrate reflection characteristics at the terminal connected to the antenna array 130 in the interposer 120. The reflection characteristics S(1, 1) illustrate reflection characteristics at the terminal connected to the RFIC 110 in the interposer 120.

The graph illustrated in FIG. 5A illustrates that, for signals of about 27 GHz to about 40 GHz, the bandpass characteristics S(2, 1) (dB) of the interposer 120 are on the order of 0.1 to 0.2 dB. In addition, the graph illustrated in FIG. 5B illustrates that, for a signal of about 28 GHz and a signal of about 39 GHz, the reflection characteristics S(2, 1) and S(1, 1) (dB) of the interposer 120 are on the order of −22 to −25 dB. That is, it is clear from the graphs illustrated in FIGS. 5A and 5B that the interposer 120 is a filter circuit having high signal transfer characteristics for about 28 GHz and about 39 GHz. Note that the RFIC 110 has an impedance of 30Ω and the antenna array has an impedance of 50Ω, and thus the interposer 120 may also function as a matching circuit in which the characteristic impedance of the second transmission line 123 is set to the order of 35Ω and that performs impedance conversion from 30Ω to 50Ω. That is, the wiring width of a transmission line and that of a stub depend on, for example, the characteristic impedance, and thus the signal line 121 serving as the first transmission line, the second transmission line 123, and the second stub 124 may be wiring lines having different structures such as having different wiring widths from each other.

As illustrated in FIGS. 3A, 3B and 3C, the interposer 120 according to the first embodiment is a circuit board that has a multilayer structure and that establishes a connection between layers using a via conductor, and includes the signal line 121 (122) and the second transmission line 123, which are connected in series at Bl (FIG. 4), and the signal line 122 (121) and the second stub 124, which are respectively connected to the signal line 121 (122) and the second transmission line 123. The signal line 122 (121) serving as the first stub and the second stub 124 are formed by wiring lines provided in respective different layers. The second transmission line 123, which connects the first stub to the second stub 124, includes a via conductor and a wiring line that is provided in the layer where the second stub 124 is formed. Consequently, compared with a case where the first stub is connected to the second stub only by via conductors, the interposer 120 according to the first embodiment can be made more compact and the transmission loss at the interposer 120 can be suppressed.

Note that it has been described that the interposer 120 has a configuration in which the switches of the RFIC 110 switch between a case where the signal line 121 serves as the first transmission line and a case where the signal line 121 serves as the first stub; however, the interposer 120 may have a configuration in which the signal line 121 is fixed as either the first transmission line or the first stub.

The interposer 120 may further include a ground conductor provided between the layer where the first stub is formed and the layer where the second stub is formed. By providing a grounded wiring layer (a ground conductor) between the first stub and the second stub, for example, the formation of capacitance or inductance can be suppressed between the first stub and the second stub, and the electromagnetic effects can be eliminated. In contrast, the interposer may have no ground conductor between the layer where the first stub is formed and the layer where the second stub is formed and may be configured to use the electromagnetic effects caused by the signal lines 121 and 122, the second transmission line 123, and the second stub 124.

The wiring line of the second stub 124 and the wiring line of the second transmission line 123 provided in the layer where the second stub 124 is formed (Layer 5) may have the same structure. For example, there is no need to perform different processes for each wiring line when the second stub 124 and the second transmission line 123 are formed using the same strip line, and thus the manufacturing cost can be reduced. That is, in a case where the impedance of the RFIC 110 is equal to the impedance of the antenna array 130, it is unnecessary to perform impedance conversion using the second transmission line 123. Thus, the manufacturing cost can be reduced by causing the second transmission line 123, the second stub, and furthermore the signal line 121 serving as the first transmission line to be wiring lines having the same structure.

In the interposer 120 according to the first embodiment, the first stub and the second stub are short-circuit stubs having end portions connected to the first transmission line and the second transmission line 123 in a respective manner and having the other end portions connected to ground (see FIG. 2). By connecting short-circuit stubs to the first transmission line and the second transmission line 123, static electricity that has built up on the antenna can be released to a ground electrode GND, and electronic devices such as the RFIC 110 can be protected from electrostatic discharge (ESD) caused by the stubs. Note that each of the first stub and the second stub does not have to be a short-circuit stub, and either of the first stub and the second stub may be an open-circuit stub.

(First Modification)

Figure 6:
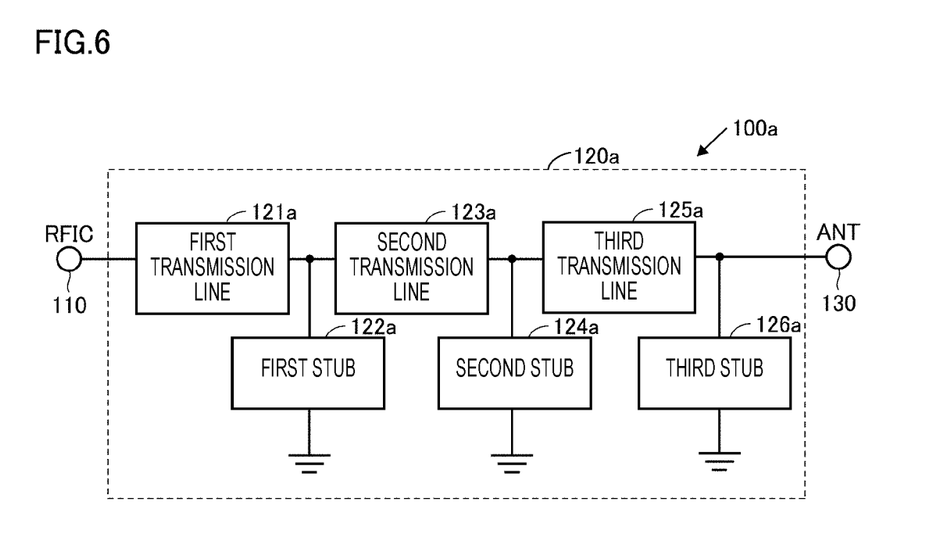
FIG. 6 is a block diagram of an example of an antenna module according to a first modification.

In the above-described embodiment, the circuit configuration has been described in which two sets of a transmission line and a stub are connected in series as illustrated in FIG. 2. In a first modification, a circuit configuration will be described in which three or more sets of a transmission line and a stub are connected in series. FIG. 6 is a block diagram of an example of an antenna module 100a according to the first modification. The antenna module 100a includes the RFIC 110, an interposer 120a, and the antenna array (ANT)

130. Note that, in the antenna module 100a, the same configurations as those of the antenna module 100 illustrated in FIG. 2 will be denoted by the same reference numerals, and a description thereof will not be repeated. In addition, FIG. 6 illustrates a configuration in which the RFIC 110 is connected to the interposer 120a through one terminal in order to simplify a description; however, as described using FIG. 2, the RFIC 110 may be connected to the interposer 120a through the Tx and Rx terminals of the RFIC 110 therein, as illustrated in FIG. 1.

In the interposer 120a illustrated in FIG. 6, a first transmission line 121a, a second transmission line 123a, and a third transmission line 125a are connected in series between the RFIC 110 and the antenna array (ANT) 130. Furthermore, in the interposer 120a, a first stub 122a, a second stub 124a, and a third stub 126a are respectively provided between the first transmission line 121a and the second transmission line 123a, between the second transmission line 123a and the third transmission line 125a, and between the third transmission line 125a and the antenna array (ANT) 130.

Even in the interposer 120a according to the first modification, the second transmission line 123a includes a wiring line provided in the layer where the second stub 124a is formed, and the third transmission line 125a includes a wiring line provided in the layer where the third stub 126a is formed. Consequently, compared with the case where stubs formed in different layers are connected to each other only by via conductors, the interposer 120a can be made more compact and the transmission loss at the interposer 120a can be suppressed.

Note that each of the second transmission line 123a and the third transmission line 125a does not need to include a wiring line provided in the layer where a stub is formed, and it may be sufficient that at least one of the transmission lines include a wiring line provided in the layer where a stub is formed.

(Second Modification)

Figure 7A:
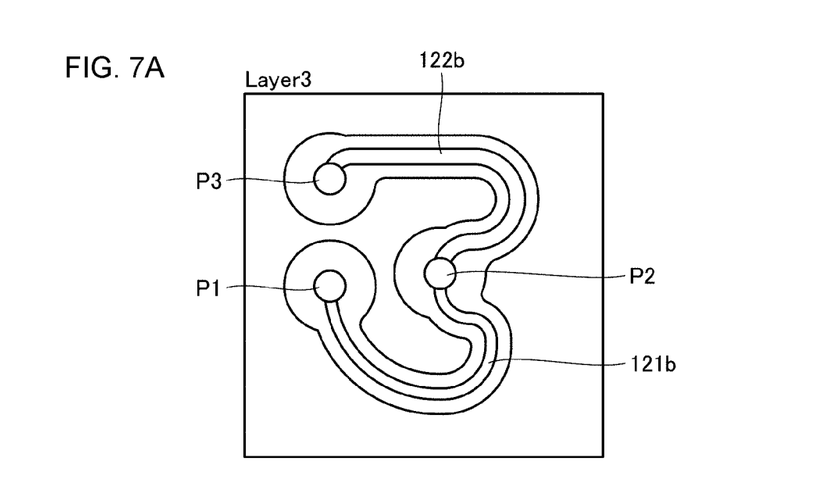
FIGS. 7A and 7B include wiring diagrams of an example of an interposer according to a second modification.
Figure 7B:
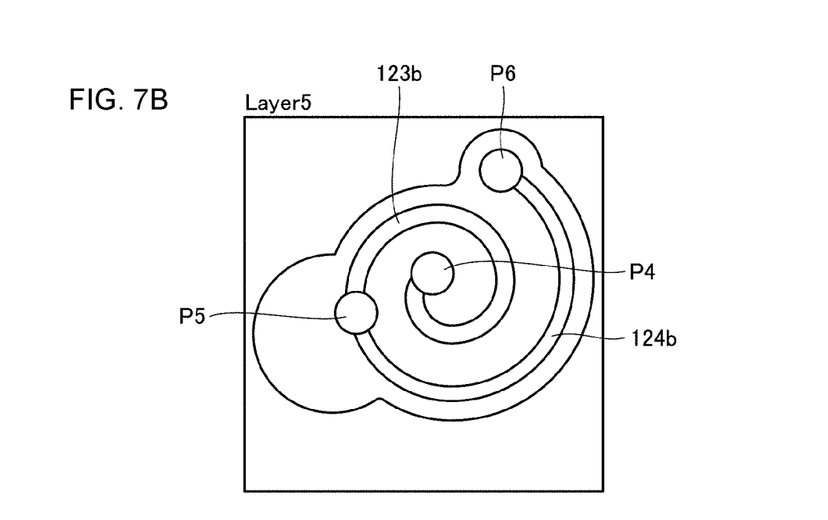

In the embodiment as illustrated in FIG. 3A described above, the wiring line shapes of the signal lines 121 and 122, the second transmission line 123, and the second stub 124 are formed mainly using straight lines as illustrated in FIGS. 3A, 3B and 3C. In a second modification, a case will be described where the wiring line shapes of transmission lines and stubs are formed using curved lines. FIGS. 7A and 7B include wiring diagrams of an example of an interposer according to the second modification. FIG. 7A illustrates a wiring diagram of Layer 3 of the interposer, and FIG. 7B illustrates a wiring diagram of Layer 5 of the interposer. Note that the layer structure of the interposer according to the second modification is the same as that of the interposer 120 illustrated in FIG. 3A, and thus a detailed description thereof will not be repeated. In addition, the interposer according to the second modification has the same configuration as the interposer 120 according to the first embodiment as illustrated in FIG. 3A except for the shapes of wiring lines therein.

In Layer 3 of the interposer illustrated in FIG. 7A, a signal line 121b serving as the first transmission line and a signal line 122b serving as the first stub are formed. The signal line 121b has a shape formed by combining a plurality of curved lines, the via pad P1 is formed at one end of the signal line 121b, and a via pad P2 for establishing a connection to a second transmission line 123b of a lower layer is formed at the other end of the signal line 121b. The signal line 122b has a shape including a curved line forming a semicircle, one end of the signal line 122b is connected to the via pad P2, and the via pad P3 is formed at the other end of the signal line 122b.

In Layer 5 of the interposer illustrated in FIG. 7B, the second transmission line 123b and a second stub 124b are formed. The second transmission line 123b and the second stub 124b are curved lines and form, in particular, a continuous winding shape. The via pad P4 for establishing a connection to the first transmission line of the upper layer is formed at one end of the second transmission line 123b, and the via pad P5 is formed at the other end of the second transmission line 123b. One end of the second stub 124b is connected to the via pad P5, and a via pad P6 is formed at the other end of the second stub 124b.

In the interposer according to the second modification, wiring lines of the stubs (the first stub, the second stub 124b as illustrated in FIG. 7B) and the signal lines (the first transmission line, the second transmission line 123b as illustrated in FIG. 7B) provided in the layers where the stubs are formed are curved lines or have winding shapes. Consequently, in this interposer, the shapes of the wiring lines are more flexibly formed and a wiring line having the same length can be formed in a smaller region than in the case where stubs or signal lines are formed by straight lines.

Note that the wiring line shapes of the signal lines 121b and 122b, the second transmission line 123b, and the second stub 124b illustrated in FIGS. 7A and 7B are examples and may be different shapes. For example, the signal lines 121b and 122b may have winding shapes, and the second transmission line 123b and the second stub 124b may have reverse winding shapes. With the reverse winding shapes, unnecessary resonance due to coupling of lines of upper and lower layers can be prevented in a case where Layer 4 (FIG. 11) is not a GND layer.

Second Embodiment

Figure 8:
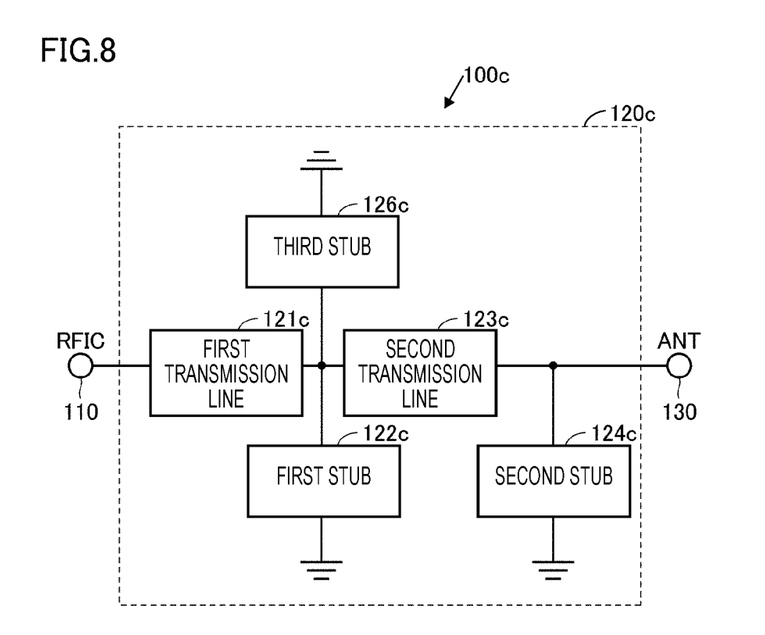
FIG. 8 is a block diagram of an example of an antenna module according to a second embodiment.

In the first embodiment, the configuration of the interposer 120 is described in which the first stub and the second stub 124 are respectively connected to the first transmission line and the second transmission line 123 as illustrated in FIGS. 2 and 3C. In a second embodiment, the configuration of an interposer will be described in which another stub for harmonic wave suppression is additionally connected to the first transmission line. FIG. 8 is a block diagram of an example of an antenna module 100c according to the second embodiment. Note that, in the antenna module 100c, the same configurations as those of the antenna module 100 illustrated in FIG. 2 will be denoted by the same reference numerals, and a description thereof will not be repeated. In addition, FIG. 8 illustrates a configuration in which the RFIC 110 is connected to an interposer 120c through one terminal in order to simplify a description; however, as described using FIG. 2, the RFIC 110 may be connected to the interposer 120c through the Tx and Rx terminals of the RFIC 110 therein, as illustrated in FIG. 1.

In the interposer 120c illustrated in FIG. 8, a first transmission line 121c and a second transmission line 123c are connected in series between the RFIC 110 and the antenna array (ANT) 130. Furthermore, in the interposer 120c, a first stub 122c and a second stub 124c are respectively provided between the first transmission line 121c and the second transmission line 123c and between the second transmission line 123c and the antenna array (ANT) 130. Furthermore, in the interposer 120c, a third stub 126c is additionally provided between the first transmission line 121c and the second transmission line 123c.

In the interposer 120c according to the second embodiment, a matching circuit is realized in which, while a resonance is achieved in each of two specific frequency bands (for example, the 28 GHz band and the 39 GHz band), the second harmonic waves in each frequency band are attenuated by provision of the third stub 126c.

Figure 9A:
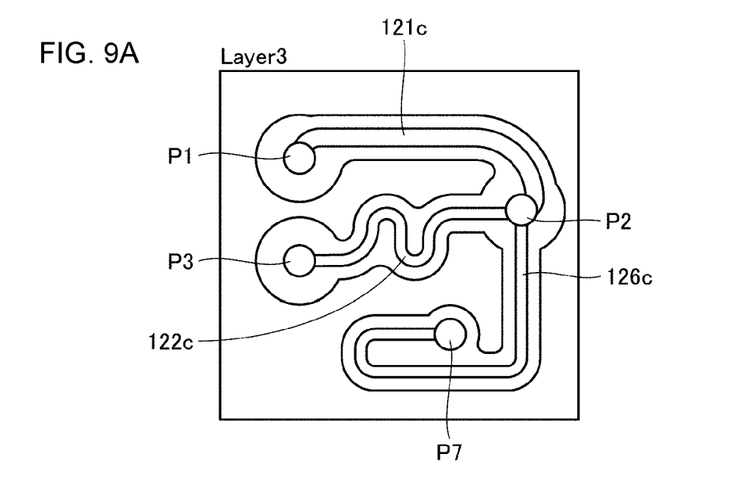
FIGS. 9A and 9B include wiring diagrams of an example of an interposer according to the second embodiment.
Figure 9B:
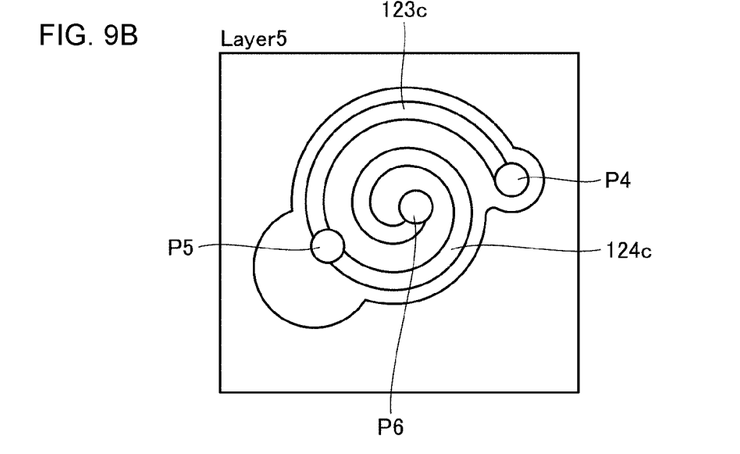

FIGS. 9A and 9B include wiring diagrams of an example of the interposer 120c according to the second embodiment. FIG. 9A is a wiring diagram of Layer 3 of the interposer 120c (FIG. 8), and FIG. 9B is a wiring diagram of Layer 5 of the interposer 120c. Note that the layer structure of the interposer 120c is the same as that of the interposer 120 illustrated in FIG. 3A, and thus a detailed description thereof will not be repeated.

In Layer 3 of the interposer 120c illustrated in FIG. 9A, the first transmission line 121c and the first stub 122c are formed. The first transmission line 121c has a shape partially including a curved line, the via pad P1 is formed at one end of the first transmission line 121c, and a via pad P2 for establishing a connection to the second transmission line 123c of a lower layer is formed at the other end of the first transmission line 121c. The first stub 122c has a shape formed by combining a plurality of curved lines, one end of the first stub 122c is connected to the via pad P2, and the via pad P3 is formed at the other end of the first stub 122c.

Furthermore, in Layer 3 of the interposer 120c, the third stub 126c is formed, which is connected to the first transmission line 121c. The third stub 126c has a shape formed by connecting three straight lines by two curved lines, one end of the third stub 126c is connected to the via pad P2, and a via pad P7 is formed at the other end of the third stub 126c. The third stub 126c is, like the first stub 122c, formed in Layer 3, but is a different stub from the first stub 122c and the second stub 124c. Note that the first stub 122c and the second stub 124c are a plurality of stubs formed in different layers.

In Layer 5 of the interposer 120c illustrated in FIG. 9B, the second transmission line 123c and the second stub 124c are formed. The second transmission line 123c and the second stub 124c are curved lines and form, in particular, a continuous winding shape. The via pad P4 for establishing a connection to the first transmission line of the upper layer is formed at one end of the second transmission line 123c, and the via pad P5 is formed at the other end of the second transmission line 123c. One end of the second stub 124c is connected to the via pad P5, and the via pad P6 is formed at the other end of the second stub 124c.

Figure 10A:
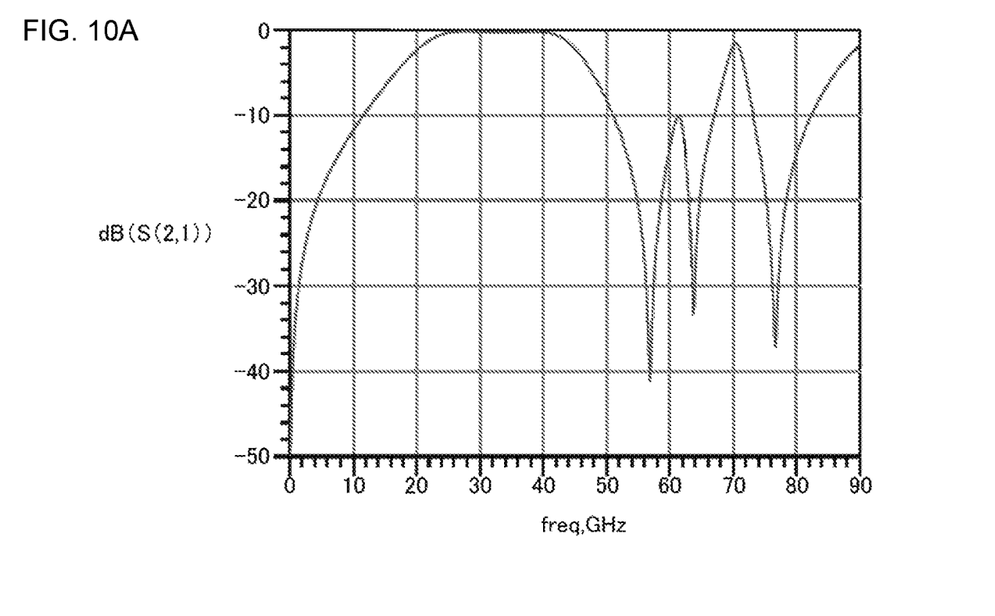
FIGS. 10A and 10B include graphs illustrating an example of circuit characteristics of the interposer according to the second embodiment.
Figure 10B:
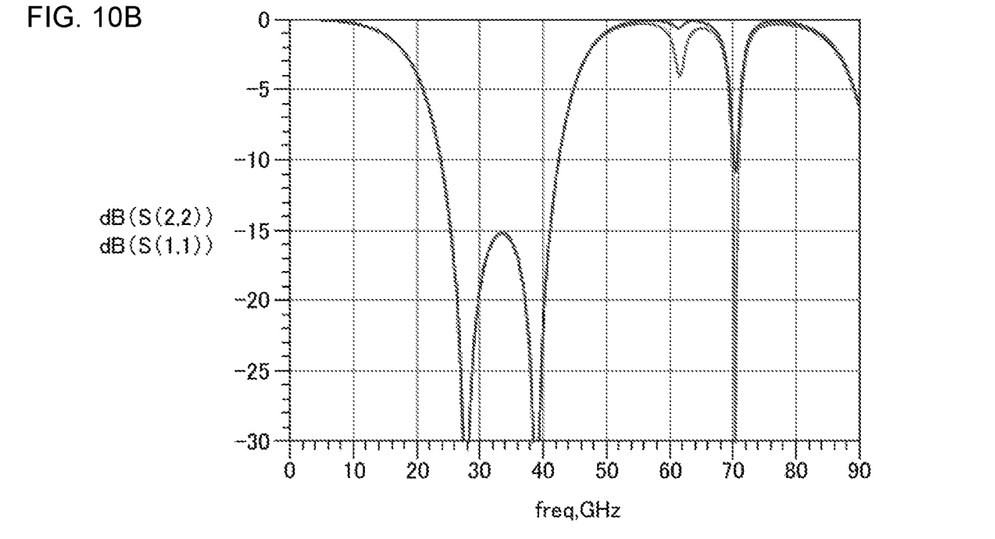

Next, circuit characteristics obtained in a case where the interposer 120c has the circuit configuration illustrated in FIG. 8 will be described in detail. FIGS. 10A and 10B include graphs illustrating an example of circuit characteristics of the interposer 120c according to the second embodiment therein, as illustrated in FIG. 8. For signals of respective frequencies, FIG. 10A illustrates bandpass characteristics and FIG. 10B illustrates reflection characteristics. In the graph illustrated in FIG. 10A, the horizontal axis represents frequency Freq (GHz) and the vertical axis represents bandpass characteristics S(2, 1) (dB). In the graph illustrated in FIG. 10B, the horizontal axis represents frequency Freq (GHz) and the vertical axis represents reflection characteristics S(2, 2), S(1, 1) (dB).

The graph illustrated in FIG. 10A illustrates that, for signals of about 27 GHz to about 40 GHz, the interposer 120c has bandpass characteristics S(2, 1) (dB) on the order of 0.1 to 0.2 dB. Furthermore, for a second harmonic wave signal (about 56 GHz) with respect to a resonant frequency of about 28 GHz, the interposer 120c has bandpass characteristics S(2, 1) (dB) on the order of −42 dB. In addition, for a second harmonic wave signal (about 78 GHz) with respect to a resonant frequency of about 39 GHz, the interposer 120c has bandpass characteristics S(2, 1) (dB) on the order of −36 dB.

The graph illustrated in FIG. 5B illustrates that, for a signal of about 28 GHz and a signal of about 39 GHz, the interposer 120c has reflection characteristics S(2, 1), S(1, 1) (dB) less than or equal to −30 dB. That is, the interposer 120c is a filter circuit having characteristics with which a signal of about 28 GHz and a signal of about 39 GHz are transferred and second harmonic wave signals with respect to the respective resonant frequencies are attenuated. Note that, similarly to the interposer 120 illustrated in FIG. 2, the interposer 120c also functions as a matching circuit in which the characteristic impedance of the second transmission line 123c is set to the order of 35Ω and that performs impedance conversion from 30Ω to 50Ω.

As illustrated in FIG. 8, in the interposer 120c according to the second embodiment, a different stub (for example, the third stub 126c) from a plurality of stubs formed in different layers (for example, the first stub 122c and the second stub 124c) is connected to at least one signal line (for example, the first transmission line 121c). Consequently, the interposer 120c according to the present embodiment can have characteristics with which the second harmonic wave signals with respect to the resonant frequencies can be attenuated.

Other Modifications

It is assumed that the antenna module described in the embodiment above has a configuration obtained by connecting the antenna array 130, which is configured separately from the circuit board module 200, to the circuit board module 200 as described using FIG. 1. However, the configuration of the antenna module is not limited to that obtained by connecting the antenna array, which is configured separately from the circuit board module, to the circuit board module, and for example may be a configuration in which an antenna is formed on the circuit board of the interposer.

Figure 11:
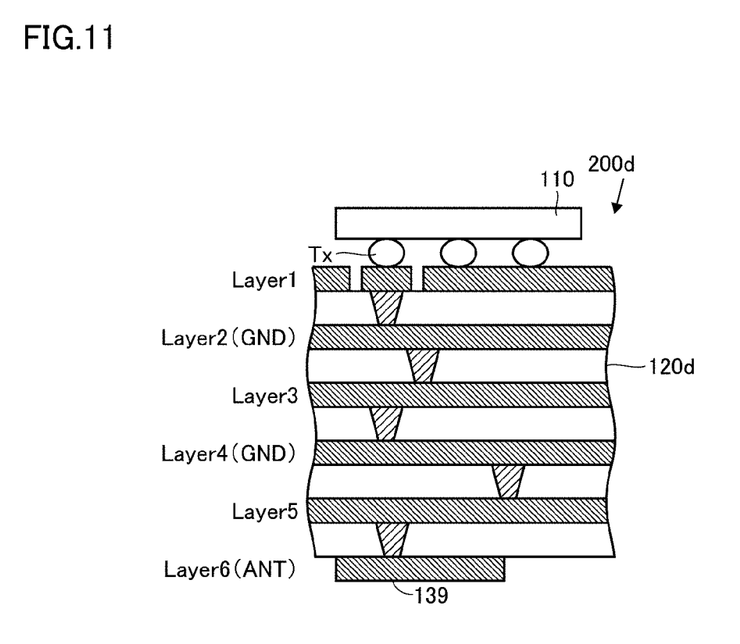
FIG. 11 is a schematic diagram of an example of a circuit board module, in which an antenna is formed on a circuit board.

FIG. 11 is a schematic diagram of an example of a circuit board module 200d, in which an antenna is formed on the circuit board. FIG. 11 illustrates a cross section of the circuit board module 200d. The circuit board module 200d includes the RFIC 110 and a circuit board 120d. Note that an antenna is formed on the circuit board 120d, and thus the circuit board 120d is not referred to as "an interposer" as described using FIG. 1 and is simply referred to as "a circuit board." In the configuration of the circuit board module 200d, the same configurations as those of the circuit board module 200 illustrated in FIG. 3A will be denoted by the same reference numerals, and a description thereof may not be repeated.

The circuit board 120d has a multilayer structure having Layers 1, 2, 3, 4, 5 and 6 as illustrated in FIG. 11, and connections between the layers are established by via conductors. In Layer 1 of the circuit board 120d, a wiring line for establishing a connection to a bump terminal of the RFIC 110 (for example, the Tx terminal) is formed. On Layer 6 of the circuit board 120d, an emitting electrode 139 of the antenna (ANT) is formed. The emitting electrode 139 is electrically connected by a via conductor to Layer 5 of the circuit board 120d where the second transmission line is formed. The number of emitting electrodes 139 formed on the circuit board is not limited to one as illustrated in FIG. 11, and a plurality of emitting electrodes may be formed to constitute an array antenna. In addition, the emitting electrode 139 does not have to be formed on a surface of the circuit board and be configured to be exposed as illustrated in FIG. 11. The emitting electrode 139 may be formed in the circuit board and be configured to be unexposed.

The embodiments disclosed herein are examples in all respects and should not be considered to be restrictions. The scope of the present disclosure is represented not by the description above but by the claims, and is intended to include all changes within the claims and the meaning and range of equivalents of the claims.

100, 100a, 100c antenna module
111A, 111B switch
120, 120a, 120c interposer
121, 121b, 122, 122b signal line
121a, 121c first transmission line
122a, 122c first stub
123, 123a, 123b, 123c second transmission line
124, 124a, 124b, 124c second stub
125a third transmission line
126a, 126c third stub
130 antenna array
131 antenna
200 circuit board module

The invention claimed is:

1. A circuit board having a multilayer structure and establishing a connection between layers using via conductors, the circuit board comprising:
   a plurality of signal lines including at least a first signal line and a second signal line, the first signal line and the second signal line being connected in series; and
   a plurality of stubs connected to respective ones of the plurality of signal lines, the plurality of stubs including at least a first stub and a second stub, the first stub being connected to the first signal line and the second stub being connected to the second signal line, wherein:
   the first stub comprises a first wiring line, and the second stub comprises a second wiring line, the first wiring line and the second wiring line being provided in different layers of the multilayer structure,
   the second signal line is connected between the first stub and the second stub, and
   the second signal line comprises a third wiring line and at least one of the via conductors, such that the third wiring line is connected to the first wiring line of the first stub by the at least one of the via conductors.

2. The circuit board according to claim 1, wherein the first and second wiring lines, and wiring lines of the signal lines in layers of the multilayer structure where the first and second stubs are provided, are curved lines.

3. The circuit board according to claim 2, further comprising:
   a ground conductor provided between the layers of the multilayer structure where the first and second stubs are provided.

4. The circuit board according to claim 2, wherein the first wiring line of the first stub and the third wiring line of the second signal line have a same structure.

5. The circuit board according to claim 2, wherein the plurality of stubs are each an open-circuit stub.

6. The circuit board according to claim 2, wherein a different stub from the plurality of stubs is connected to at least one of the plurality of signal lines.

7. The circuit board according to claim 1, wherein the plurality of stubs are each an open-circuit stub.

8. The circuit board according to claim 1, wherein the plurality of stubs are each a short-circuit stub having one end portion connected to the respective one of the plurality of signal lines and another end portion connected to ground.

9. A circuit board module configured to be connected to an antenna, the circuit board module comprising:
   the circuit board according to claim 1; and
   a radio frequency integrated circuit device mounted on the circuit board and connected to one end portion of the plurality of signal lines,
   wherein the circuit board has, on a surface on an opposite side to a surface where the radio frequency integrated circuit device is mounted, a connection portion connecting the antenna to another end portion of the plurality of signal lines.

10. An antenna module comprising:
    an antenna;
    the circuit board according to claim 1; and
    a radio frequency integrated circuit device mounted on the circuit board and connected to one end portion of the plurality of signal lines, wherein
    the circuit board has, on a surface on an opposite side to a surface where the radio frequency integrated circuit device is mounted, a connection portion connecting the antenna to another end portion of the plurality of signal lines.

11. The circuit board according to claim 1, wherein the first and second wiring lines, and wiring lines of the signal lines in layers of the multilayer structure where the first and second stubs are provided, have spiral shapes.

12. The circuit board according to claim 11, wherein a different stub from the plurality of stubs is connected to at least one of the plurality of signal lines.

13. The circuit board according to claim 11, wherein the first wiring line of the first stub and the third wiring line of the second signal line have a same structure.

14. The circuit board according to claim 11, further comprising:
    a ground conductor provided between the layers of the multilayer structure where the first and second stubs are provided.

15. The circuit board according to claim 1, further comprising:
    a ground conductor provided between the layers of the multilayer structure where the first and second stubs are provided.

16. The circuit board according to claim 15, wherein the first wiring line of the first stub and the third wiring line of the second signal line have a same structure.

17. The circuit board according to claim 1, wherein a different stub from the plurality of stubs is connected to at least one of the plurality of signal lines.

18. The circuit board according to claim 17, wherein the first wiring line of the first stub and the third wiring line of the second signal line have a same structure.

19. The circuit board according to claim 17, further comprising:
    a ground conductor provided between the layers of the multilayer structure where the first and second stubs are provided.

20. The circuit board according to claim 1, wherein the first wiring line of the first stub and the third wiring line of the second signal line have a same structure.

* * * * *